United States Patent
Kim et al.

(10) Patent No.: US 11,522,146 B2
(45) Date of Patent: Dec. 6, 2022

(54) PHOTODETECTOR BASED ON TRANSITION METAL DICHALCOGEN COMPOUND AND METHOD OF MANUFACTURING THE SAME

(71) Applicant: IUCF-HYU (Industry-University Cooperation Foundation Hanyang University), Seoul (KR)

(72) Inventors: Tae Whan Kim, Seoul (KR); Jeong Heon Lee, Seoul (KR); Young Pyo Jeon, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 153 days.

(21) Appl. No.: 16/944,486

(22) Filed: Jul. 31, 2020

(65) Prior Publication Data

US 2021/0151700 A1 May 20, 2021

(30) Foreign Application Priority Data

Nov. 20, 2019 (KR) .......................... 10-2019-0149378

(51) Int. Cl.
*H01L 27/146* (2006.01)
*H01L 51/44* (2006.01)
(Continued)

(52) U.S. Cl.
CPC ........ *H01L 51/447* (2013.01); *H01L 51/0097* (2013.01); *H01L 51/426* (2013.01); *H01L 51/442* (2013.01)

(58) Field of Classification Search
CPC . H01L 51/447; H01L 51/0097; H01L 51/426; H01L 51/442; H01L 31/0324; H01L 31/022466; H01L 31/0328; H01L 31/08; H01L 2031/0344; H01L 25/167; H01L 27/14643; H01L 27/3227; H01L 31/02024; H01L 31/0203; H01L 31/0284;
(Continued)

(56) References Cited

U.S. PATENT DOCUMENTS

2011/0101365 A1* 5/2011 Kim .................... H01L 51/0529
257/66
2017/0092876 A1* 3/2017 Murata ................. H01L 27/307
(Continued)

FOREIGN PATENT DOCUMENTS

CN 108313987 A * 7/2018 ............. B82Y 40/00
KR 10-2013-0107905 A 10/2013
(Continued)

*Primary Examiner* — Samuel Park
(74) *Attorney, Agent, or Firm* — Novick, Kim & Lee PLLC; Jae Youn Kim

(57) ABSTRACT

Disclosed are a photodetector using a photoelectric conversion effect wherein current changes according to light; and a method of manufacturing the photodetector. More particularly, a photodetector manufactured using a transition metal dichalcogen compound having high sensitivity to wavelengths of light in the visible light region by forming a sensor layer utilizing a transition metal dichalcogen compound such that the thickness of the sensor layer can be adjusted is provided.

9 Claims, 9 Drawing Sheets

(51) Int. Cl.
*H01L 51/42* (2006.01)
*H01L 51/00* (2006.01)

(58) Field of Classification Search
CPC . H01L 31/1032; H01L 31/107; H01L 27/146; Y02E 10/549
See application file for complete search history.

(56) References Cited

U.S. PATENT DOCUMENTS

| | | | |
|---|---|---|---|
| 2019/0013368 A1* | 1/2019 | Chung | H01L 27/30 |
| 2020/0099003 A1* | 3/2020 | Ujiie | H01L 51/442 |
| 2020/0136063 A1* | 4/2020 | Kwon | H01L 51/0071 |
| 2020/0343392 A1* | 10/2020 | Chung | H01L 27/14614 |

FOREIGN PATENT DOCUMENTS

| | | |
|---|---|---|
| KR | 10-2014-0037702 A | 3/2014 |
| KR | 10-2016-0017491 A | 2/2016 |
| KR | 10-2017-0001160 A | 1/2017 |
| KR | 10-1927579 B1 | 12/2018 |
| KR | 10-2031594 B | 10/2019 |

* cited by examiner

410

| Element | Atomic % |
|---|---|
| C | 61.18 |
| O | 10.05 |
| S | 20.32 |
| In | 0.93 |
| Sn | 0.23 |
| W | 7.29 |
| Total: | 100.00 |

500

510

PHOTODETECTOR BASED ON TRANSITION METAL DICHALCOGEN COMPOUND AND METHOD OF MANUFACTURING THE SAME

CROSS-REFERENCE TO RELATED APPLICATION

This application claims priority to Korean Patent Application No. 10-2019-0149378, filed on Nov. 20, 2019 in the Korean Intellectual Property Office, the disclosure of which is incorporated herein by reference.

BACKGROUND OF THE DISCLOSURE

Field of the Disclosure

The present disclosure relates to a technical idea of manufacturing a photodetector using a transition metal dichalcogen compound, and more particularly to a photodetector configured to control the thickness of a sensor layer to have high sensitivity to light wavelengths in the visible light region when using a photoelectric conversion effect wherein current changes according to light.

Description of the Related Art

Photodetectors use the characteristic that electrical characteristics of materials or electronic devices change according to light.

Generally, photodetectors are used in consideration of use purposes such as the area of detected light, detection precision, characteristics of light, mass productivity, and reliability.

As a first photodetector type, there are phototubes and photomultiplier tubes using photoelectron emission (external photoelectric effect).

As a second photodetector type, there are various devices using the internal photoelectric effect in semiconductors, e.g., photoconductive cells and photodiodes using the photoconductive effect, phototransistors, avalanche photodiodes, and photoelectric cells using the photovoltaic effect.

As a third photodetector type, there are thermal detectors using light absorption, e.g., thermocouple detectors, bolometers, Golay cells, pyroelectric photodetectors using the pyroelectric effect, and the like.

A photodetector has the function of absorbing light energy into a semiconductor and converting the same into electrical energy.

In semiconductors, light absorption means that electrons are excited by light beyond an energy gap.

In the case of photoexcitation in semiconductors, electrons cause interband transition or intraband transition. Particularly, since interband transition has a high possibility of transition, it is common to perform photoelectric conversion using interband transition.

Among the types of photodetectors, a semiconductor diode-type photodetector uses carrier generation and transmission characteristics at a junction of the same or different semiconductors.

When a p-n junction is formed on a silicon substrate and a junction interface is irradiated with light, a carrier absorbing photon energy is generated.

The flow of a carrier generated by a photodetector generates current, which becomes an electrical signal corresponding to an optical signal incident by interaction with an external circuit.

However, diode-type photodetectors, which have been subjected to an existing process as described above, have a problem that the photoreactivity is decreased when the wavelength of light is changed in the visible light region.

RELATED ART DOCUMENTS

Patent Documents (Patent Document 1) Korean Patent Application Publication No. 10-2017-0001160, "LIGHT-EMITTING DEVICE USING TWO-DIMENSIONAL TRANSITION METAL DICHALCOGEN CHEMICAL AS LIGHT-EMITTING LAYER AND METHOD OF MANUFACTURING THE SAME"

(Patent Document 2) Korean Patent Application Publication No. 10-2013-0107905, "METHOD OF MANUFACTURING CHALCOGENIDE-BASED SOLAR CELL WITH DOUBLE TEXTURE STRUCTURE, ON SUBSTRATE OF WHICH TEXTURE IS FORMED, AND CHALCOGENIDE-BASED SOLAR CELL MANUFACTURED BY THE SAME"

(Patent Document 3) Korean Patent No. 10-1927579, "THIN-FILM TRANSITION METAL DECALCOGENIDE TRANSISTOR AND METHOD OF MANUFACTURING THE SAME"

SUMMARY OF THE DISCLOSURE

Therefore, the present invention has been made in view of the above problems, and it is one object of the present invention to provide a photodetector capable of more precisely measuring photoreaction in the visible light region by changing the size of a band gap according to the thickness of a sensor layer because the sensor layer is formed using a transition metal dichalcogen compound.

It is another object of the present invention to provide a flexible photodetector by utilizing a transparent substrate and a transparent electrode and by forming a sensor layer using a peelable transition metal dichalcogen compound.

It is yet another object of the present invention to provide a photodetector having high sensitivity regardless of a change in the wavelength of light in a simple process and at low cost by forming a sensor layer using a peelable transition metal dichalcogen compound.

In accordance with an aspect of the present invention, the above and other objects can be accomplished by the provision of a photodetector, including: a light transmission layer; a lower electrode disposed on the light transmission layer; a sensor layer disposed on the lower electrode and configured to include a light absorber; and an upper electrode disposed on the sensor layer, wherein, when an electric field is applied to the lower and upper electrodes such that current flows through the sensor layer, and light is transmitted to the sensor layer through the light transmission layer, the photodetector measures an energy band gap related to a change in the current, and the measured energy band gap is determined depending upon the thickness of the sensor layer.

When the thickness of the sensor layer is 30 nm to 80 nm, the photodetector may determine an energy band gap of 2.23 Eg to 2.48 Eg for light having a wavelength of 500 nm.

The light absorber may be formed using a transition metal dichalcogen compound or any one of $MoS_2$, $WS_2$, $MoSe_2$, $WSe_2$, $MoTe_2$, $Te_2$, $ZrS_2$, and $ZrSe_2$ as heterogeneous mixtures of transition metals.

The thickness of the sensor layer may be adjusted to 30 nm to 80 nm depending upon the rate of centrifugation for liquid-phase exfoliation of the transition metal dichalcogen compound or the heterogeneous transition metal mixture.

The light transmission layer may be formed using any one of glass and quartz as silicon-based materials; and at least one of styrene-acrylonitrile copolymers (SAN), general purpose polystyrene (GPPS), poly vinyl chloride (PVC), acrylonitrile butadiene styrene (ABS), and polycarbonate (PC) as transparent plastic materials.

The light transmission layer may be formed using at least one of polyethyleneterephthalate (PET), polyethylene (PE), polystyrene (PS), poly(methylmethacrylate) (PMMA), and polydimethylsiloxane (PDMS) as polymer-based flexible materials.

The sensor layer may be formed using at least one of poly(methylmethacrylate) (PMMA), polytetrafluoroethylene (PTFE), propylene glycol methyl ether acetate (PGMA), polyethylene glycol (PEG), polyacrylonitrile (PAN), polyurethane (PU), polyvinylpyrrolidone (PVP), polyethersulfone (PES), and polyarylethersulfones (PAES).

The lower electrode may be formed using at least one of ITO, Al-doped ZnO (AZO), Ga-doped ZnO (GZO), In,Ga-doped ZnO (IGZO), Mg-doped ZnO (MZO), Mo-doped ZnO, Al-doped MgO, Ga-doped MgO, F-doped $SnO_2$, and Nb-doped $TiO_2$ as metal oxides; Ag nanowires; a highly conductive coating agent (PEDOT:PSS); and $CuAlO_2$.

The upper electrode may be used using any one of Al, Au, Ag, Cu, Pt, W, Ni, Zn, Ti, Zr, Hf, Cd, and Pd as metal materials.

The lower and upper electrodes may be formed using any one of graphene, graphene oxide, carbon nanotubes, and fullerene ($C_{60}$).

The lower and upper electrodes may be formed in any one structure of $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, and $MoO_3/Ag/MoO_3$ as multilayer structures.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
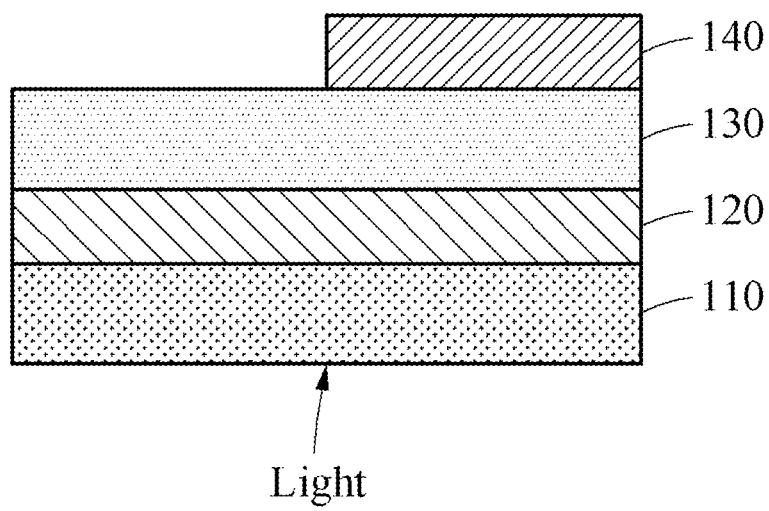
FIG. 1 illustrates a photodetector according to an embodiment of the present disclosure.

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

It should be understood that, although the terms first, second, third etc. may be used herein to describe various elements, these elements should not be limited by these terms. These terms are only used to distinguish one element from another element. For example, a first element may be termed a second element and a second element may be termed a first element without departing from the teachings of the present invention.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Expressions describing the relationship between components, for example, "between" and "immediately between" or "directly adjacent to" should be interpreted similarly.

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present invention will be described in detail with reference to the accompanying drawings. However, the scope of the present invention is not limited by these embodiments. Like reference numerals in the drawings denote like elements.

FIG. 1 illustrates a photodetector according to an embodiment of the present disclosure.

FIG. 1 illustrates components of a photodetector according to an embodiment of the present disclosure and a laminated structure thereof.

Referring to FIG. 1, a photodetector 100 according to an embodiment of the present disclosure may include a light transmission layer 110, a lower electrode 120, a sensor layer 130 and an upper electrode 140.

In accordance with an embodiment of the present disclosure, the light transmission layer 110 may include a layer on which light from the outside is incident.

For example, the light transmission layer 110 may be a transparent substrate made of a transparent material.

In accordance with an embodiment of the present disclosure, the light transmission layer 110 may be formed using any one of glass and quartz as silicon-based materials and at least one of styrene-acrylonitrile copolymers (SAN), general purpose polystyrene (GPPS), poly vinyl chloride (PVC), acrylonitrile butadiene styrene (ABS), and polycarbonate (PC) as transparent plastic materials.

For example, the lower electrode 120 may be disposed on the light transmission layer 110.

The lower electrode 120 according to an embodiment of the present disclosure may be formed using at least one of ITO, Al-doped ZnO (AZO), Ga-doped ZnO (GZO), In,Ga-doped ZnO (IGZO), Mg-doped ZnO (MZO), Mo-doped ZnO, Al-doped MgO, Ga-doped MgO, F-doped $SnO_2$, and Nb-doped $TiO_2$ as metal oxides, Ag nanowires, a highly conductive coating agent (PEDOT:PSS), and $CuAlO_2$.

In addition, the lower electrode 120 may be formed using any one of graphene, graphene oxide, carbon nanotubes, and fullerene ($C_{60}$).

In addition, the lower electrode 120 may be formed in any one structure of $CuAlO_2$/Ag/$CuAlO_2$, ITO/Ag/ITO, ZnO/Ag/ZnO, ZnS/Ag/ZnS, $TiO_2$/Ag/$TiO_2$, ITO/Au/ITO, $WO_3$/Ag/$WO_3$, and $MoO_3$/Ag/$MoO_3$ as multilayer structures.

In accordance with an embodiment of the present disclosure, the lower electrode 120 may adjust an emission direction of light incident through the light transmission layer 110 using an opaque electrode and a thin electrode.

In accordance with an embodiment of the present disclosure, the sensor layer 130 may be disposed on the lower electrode 120 and may include a light absorber for absorbing light incident through the light transmission layer 110.

For example, the sensor layer 130 may be formed using at least one of poly(methylmethacrylate) (PMMA), polytetrafluoroethylene (PTFE), propylene glycol methyl ether acetate (PGMA), polyethylene glycol (PEG), polyacrylonitrile (PAN), polyurethane (PU), polyvinylpyrrolidone (PVP), polyethersulfone (PES), and polyarylethersulfones (PAES).

In accordance with an embodiment of the present disclosure, the light absorber may be formed using any one of transition metal dichalcogen compounds (metal dichalcogen compound materials) and $MoS_2$, $WS_2$, $MoSe_2$, $WSe_2$, $MoTe_2$, $Te_2$, $ZrS_2$, and $ZrSe_2$ as heterogeneous mixtures of transition metals.

That is, the sensor layer 130 may be formed using a transition metal dichalcogen compound or a heterogeneous mixture of transition metals.

In accordance with an embodiment of the present disclosure, the thickness of the sensor layer 130 may be adjusted using a centrifugal separation technique for liquid-phase exfoliation of a transition metal dichalcogen compound.

For example, the thickness of the sensor layer 130 may be adjusted to 30 nm to 80 nm depending upon the rate of centrifugation for liquid-phase exfoliation of a transition metal dichalcogen compound or heterogeneous mixtures of transition metals.

For example, the thickness of the sensor layer 130 may be changed depending upon a centrifugal process and may not be limited to the aforementioned values.

In accordance with an embodiment of the present disclosure, the upper electrode 140 may be disposed on the sensor layer 130.

For example, the upper electrode 140 may be formed using any one of Al, Au, Ag, Cu, Pt, W, Ni, Zn, Ti, Zr, Hf, Cd and Pd as metal materials.

In addition, the upper electrode 140 may be formed using any one of graphene, graphene oxide, carbon nanotubes, and fullerene ($C_{60}$).

In addition, the upper electrode 140 may be formed in any one structure of $CuAlO_2$/Ag/$CuAlO_2$, ITO/Ag/ITO, ZnO/Ag/ZnO, ZnS/Ag/ZnS, $TiO_2$/Ag/$TiO_2$, ITO/Au/ITO, $WO_3$/Ag/$WO_3$, and $MoO_3$/Ag/$MoO_3$ as multilayer structures.

In accordance with an embodiment of the present disclosure, the upper electrode 140 may adjust an emission direction of light, incident on the sensor layer 130 through the light transmission layer 110, using an opaque electrode and a thin electrode.

In accordance with an embodiment of the present disclosure, when an electric field is applied to the lower electrode 120 and the upper electrode 140 such that current flows through the sensor layer 130, and light is transmitted to the sensor layer 130 through the light transmission layer 110, the photodetector 100 may measure an energy band gap related to a current change in the sensor layer 130.

For example, the photodetector 100 may determine an energy band gap depending upon the thickness of the sensor layer 130.

In particular, the photodetector 100 may determine an energy band gap of 2.23 Eg to 2.48 Eg for light having a wavelength of 500 nm when the thickness of the sensor layer 130 is 30 nm to 80 nm.

For example, an energy band gap related to a current change in the sensor layer 130 for light having a specific wavelength may be changed according to the wavelength of the light and the thickness of the sensor layer 130 and is not limited to the aforementioned values.

Therefore, the present disclosure utilizes a transparent substrate and a transparent electrode and forms a sensor layer using a peelable transition metal dichalcogen compound, thereby being capable of providing a flexible photodetector.

Figure 2A:
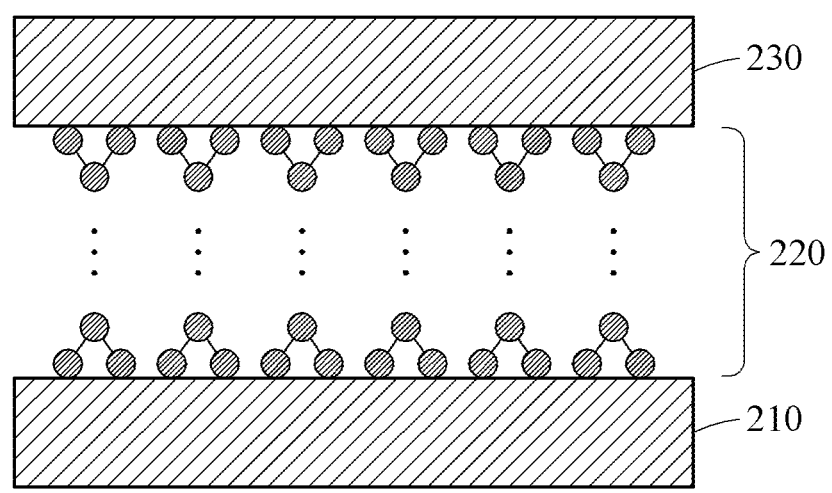
FIG. 2A illustrates a detection amount change dependent upon the thickness of a sensor layer of a photodetector according to an embodiment of the present disclosure.

FIG. 2A illustrates a detection amount change dependent upon the thickness of a sensor layer of a photodetector according to an embodiment of the present disclosure.

FIG. 2A illustrates current change detected in a sensor layer of a photodetector according to an embodiment of the present disclosure according to adjustment of the thickness of the sensor layer.

Referring to FIG. 2A, a photodetector 200 according to an embodiment of the present disclosure includes a sensor layer 220 disposed between a lower electrode 210 and an upper electrode 230.

In accordance with an embodiment of the present disclosure, the sensor layer 220 is formed using a peelable transition metal dichalcogen compound, and the thickness of the sensor layer 220 may be adjusted according to the rate of a centrifuge.

For example, the thickness of the sensor layer 220 may be adjusted to 30 nm to 80 nm, and an energy band gap is changed as the thickness of the sensor layer 220 is adjusted. Accordingly, a detection amount of light that the photodetector 200 can detect may be changed.

For example, a change in a detection amount of light may be confirmed through a spectral change. This spectral change will be described with referenced to FIG. 2B.

Figure 2B:
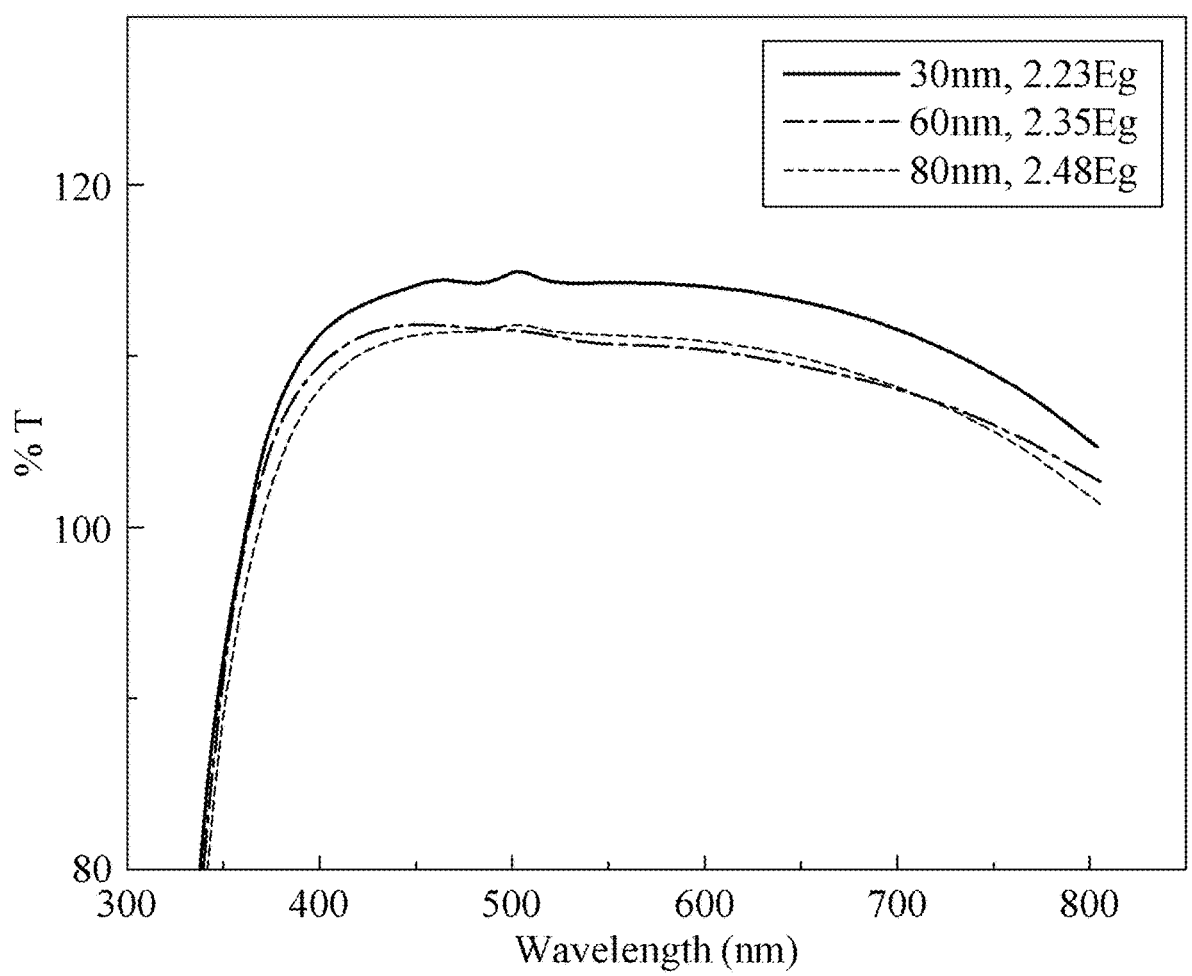
FIG. 2B illustrates energy band gap changes dependent upon the thickness of a sensor layer of a photodetector according to an embodiment of the present disclosure.

FIG. 2B illustrates energy band gap changes dependent upon the thickness of a sensor layer of a photodetector according to an embodiment of the present disclosure.

FIG. 2B illustrates energy band gap changes and spectral changes dependent upon the thickness of a sensor layer of a photodetector.

Referring to FIG. 2B, a horizontal axis of a graph 240 represents the wavelength of light incident on a light transmission layer, and a vertical axis thereof represents an energy band gap.

According to the graph 240, the photodetector may measure an energy band gap of 2.23 Eg when the wavelength of the light incident through the light transmission layer is 500 nm and the thickness of a sensor is 30 nm.

In addition, the photodetector may measure an energy band gap of 2.25 Eg when the wavelength of light incident through the light transmission layer is 500 nm and the thickness of the sensor is 60 nm.

In addition, the photodetector may measure an energy band gap of 2.48 Eg when the wavelength of light incident through the light transmission layer is 500 nm and the thickness of the sensor is 80 nm.

That is, the photodetector according to an embodiment of the present disclosure may determine an energy band gap of 2.23 Eg to 2.48 Eg for light having a wavelength of 500 nm when the thickness of the sensor layer is 30 nm to 80 nm.

Therefore, the present disclosure forms a sensor layer using a transition metal dichalcogen compound, whereby the size of an energy band gap is changed according to the thickness of a sensor layer. Accordingly, the present disclosure provides a photodetector capable of more precisely measuring photoreaction in the visible light region.

Figure 3:
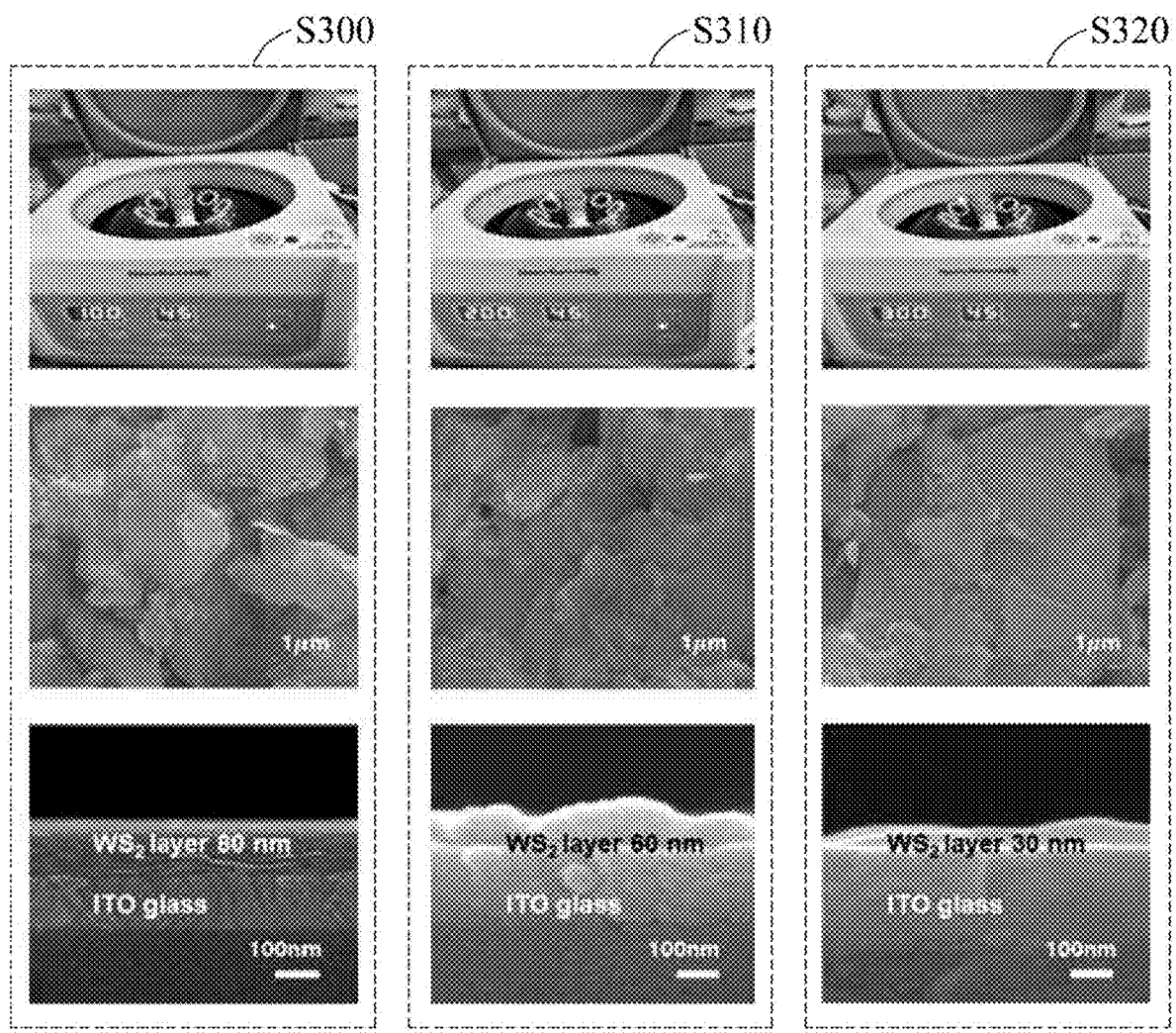
FIG. 3 illustrates thickness changes in a sensor layer of a photodetector in a centrifugal process according to an embodiment of the present disclosure.

FIG. 3 illustrates thickness changes in a sensor layer of a photodetector in a centrifugal process according to an embodiment of the present disclosure.

FIG. 3 illustrates changes in the thickness of a sensor layer according to a change in a centrifugation rate in a centrifugal process.

Referring to FIG. 3, a centrifugal process may include steps S300, S310 and S320 according to the rate of centrifugation.

Here, the centrifugal process is a process for liquid separation of a transition metal dichalcogen compound that forms a sensor layer. Tungsten disulfide ($WS_2$), as the transition metal dichalcogen compound, may be used in an amount of about 2 g, and dimethylformamide (DMF), as a solvent, may be used in an amount of about 20 ml.

In step S300, the centrifugal process is performed at a separation rate of 1000 rpm for a peeling time of 45 minutes.

Examining a scanning electron microscope image of the sensor layer in step S300, tungsten disulfide ($WS_2$), as a transition metal dichalcogen compound, is peeled off and the thickness of a sensor layer is measured to be 80 nm.

In step S310, a centrifugal process is performed at a separation rate of 2000 rpm for a peeling time of 45 minutes.

Examining a scanning electron microscope image of the sensor layer in step S310, tungsten disulfide ($WS_2$), as a transition metal dichalcogen compound, is peeled off and the thickness of a sensor layer is measured to be 60 nm.

In step S320, a centrifugal process is performed at a separation rate of 3000 rpm for a peeling time of 45 minutes.

Examining a scanning electron microscope image of the sensor layer in step S320, tungsten disulfide ($WS_2$), as a transition metal dichalcogen compound, is peeled off and the thickness of a sensor layer is measured to be 30 nm.

That is, the thickness of the sensor layer of the photodetector according to an embodiment of the present disclosure may be changed according to a change in a centrifugation rate.

The separation rate, time, compound amount, and solvent amount suggested in the above centrifugal process are merely provided as examples and may be changed according to embodiments.

Figure 4A:
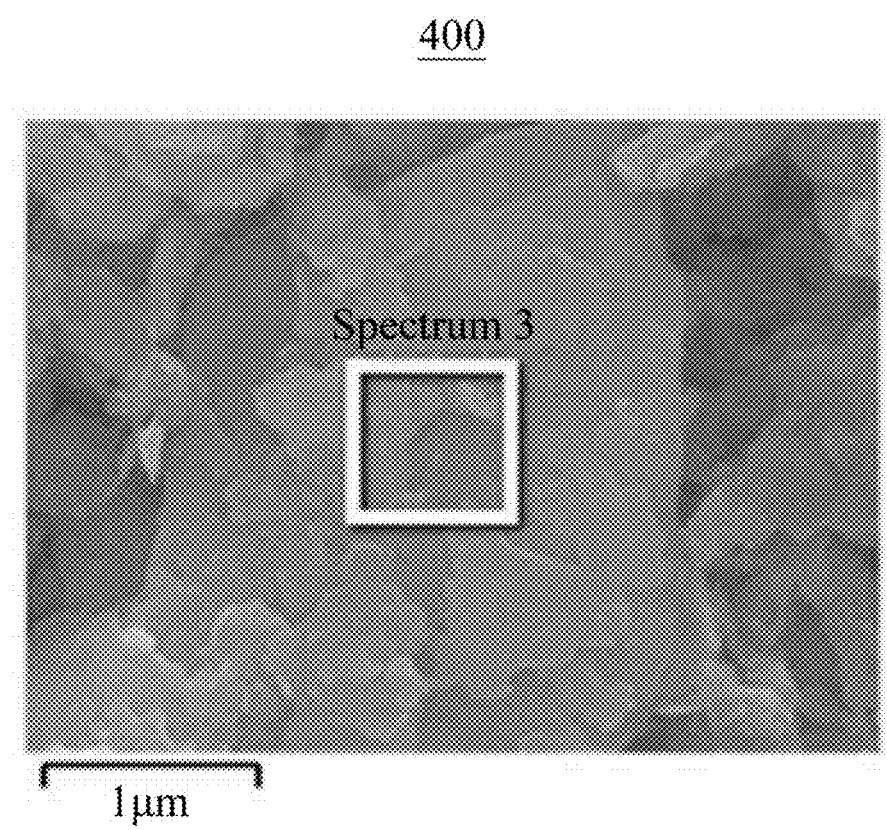
FIGS. 4A and 4B illustrate component analysis results of a photodetector according to an embodiment of the present disclosure using a scanning electron microscope image.
Figure 4B:
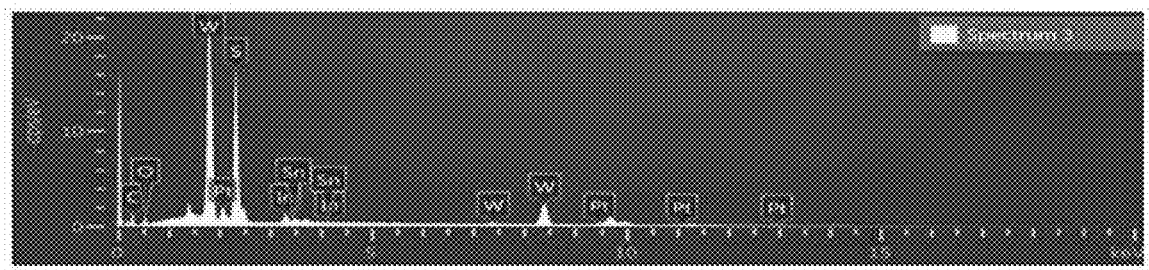

FIGS. 4A and 4B illustrate component analysis results of a photodetector according to an embodiment of the present disclosure using a scanning electron microscope image.

FIG. 4A illustrates a scanning electron microscope image of a sensor layer of a photodetector. The scanning electron microscope image may be used for scanning electron microscopic (SEM)-energy-dispersive X-ray spectroscopic (EDX) analysis.

FIG. 4B illustrates a table and graph representing analysis results of components of a sensor layer of a photodetector, particularly a scanning electron microscopy (SEM)-energy-dispersive X-ray spectroscopy (EDX) analysis result.

Referring to FIGS. 4A and 4B, a composition ratio of tungsten disulfide ($WS_2$), which is a material for forming a sensor layer, is illustrated.

According to SEM-EDX analysis, the types and contents of elements contained in a sample may be confirmed through a spectrum using X-ray energy emitted by irradiating a material for forming a sensor layer with an electron beam, and results are tabulated.

Here, as a material for forming a sensor layer used for SEM-EDX analysis, tungsten disulfide ($WS_2$), that has been peeled off at a rate of 3000 rpm for 45 minutes in a centrifugal process, may be used.

Figure 5A:
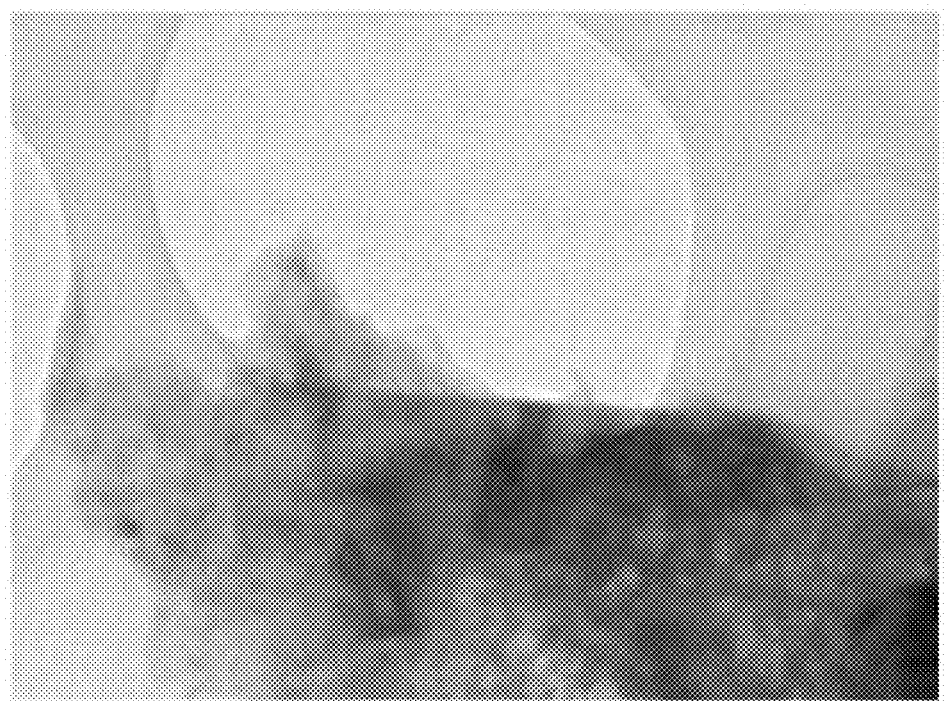
FIGS. 5A and 5B illustrate transmission electron microscope image analysis results of a photodetector according to an embodiment of the present disclosure.
Figure 5B:
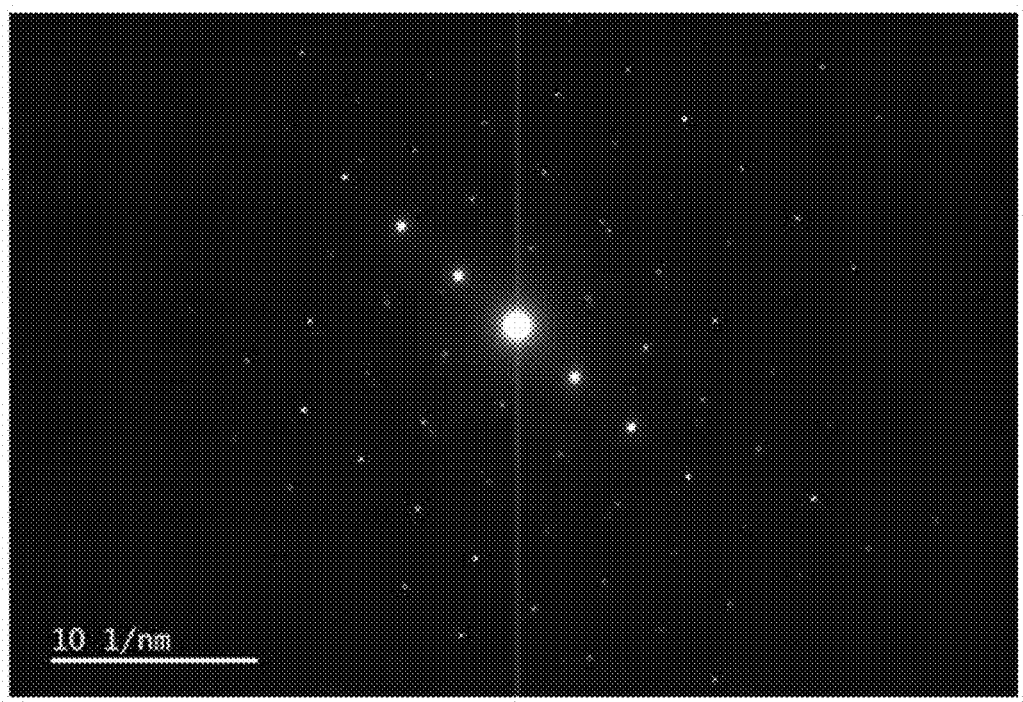

FIGS. 5A and 5B illustrate transmission electron microscope image analysis results of a photodetector according to an embodiment of the present disclosure.

FIGS. 5A and 5B illustrate transmission electron microscope images of nanosheets of tungsten disulfide ($WS_2$) that has been peeled off in step S320 of FIG. 3.

Referring to FIG. 5A, tungsten disulfide ($WS_2$) peeled off in step S320 of FIG. 3 has a shape of a corrugated sheet partially folded like a graphene sheet.

Referring to FIG. 5B, tungsten disulfide ($WS_2$) peeled off in step S320 of FIG. 3 represents a typical electron diffraction pattern of a nanosheet.

Figure 6:
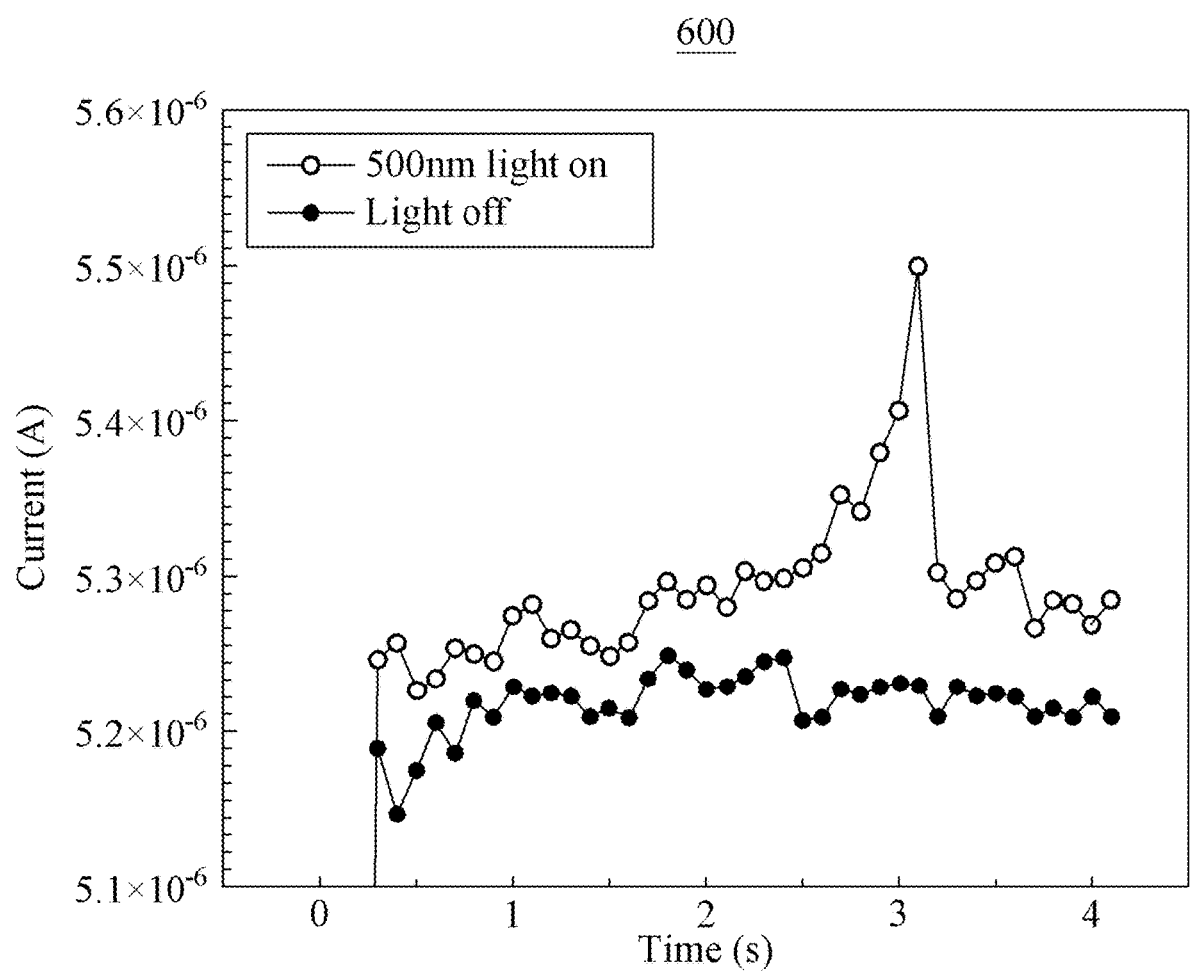
FIG. 6 illustrates light detection characteristics of a photodetector according to an embodiment of the present disclosure.

FIG. 6 illustrates light detection characteristics of a photodetector according to an embodiment of the present disclosure.

FIG. 6 illustrates current change in a sensor layer depending upon whether light is incident on a photodetector according to an embodiment of the present disclosure.

In a graph 600 of FIG. 6, a horizontal axis represents time and a vertical axis represents current.

Referring to the graph 600, a current increases in a region of 3 seconds when an electric field corresponding to a voltage of about 1 V is applied to upper and lower electrodes of the photodetector for 0 to 4 seconds and light having a wavelength of 500 nm is transmitted through a light transmission layer.

Meanwhile, when an electric field corresponding to a voltage of about 1 V is applied to the upper and lower electrodes of the photodetector for 0 to 4 seconds and light is not transmitted through the light transmission layer, there is no current change.

That is, current flowed through the sensor layer of the photodetector according to an embodiment of the present disclosure when an electric field was applied to the upper and lower electrodes, and a current change in the sensor layer occurred when light was transmitted to the sensor layer through the light transmission layer. Accordingly, an energy band gap was measured.

Figure 7:
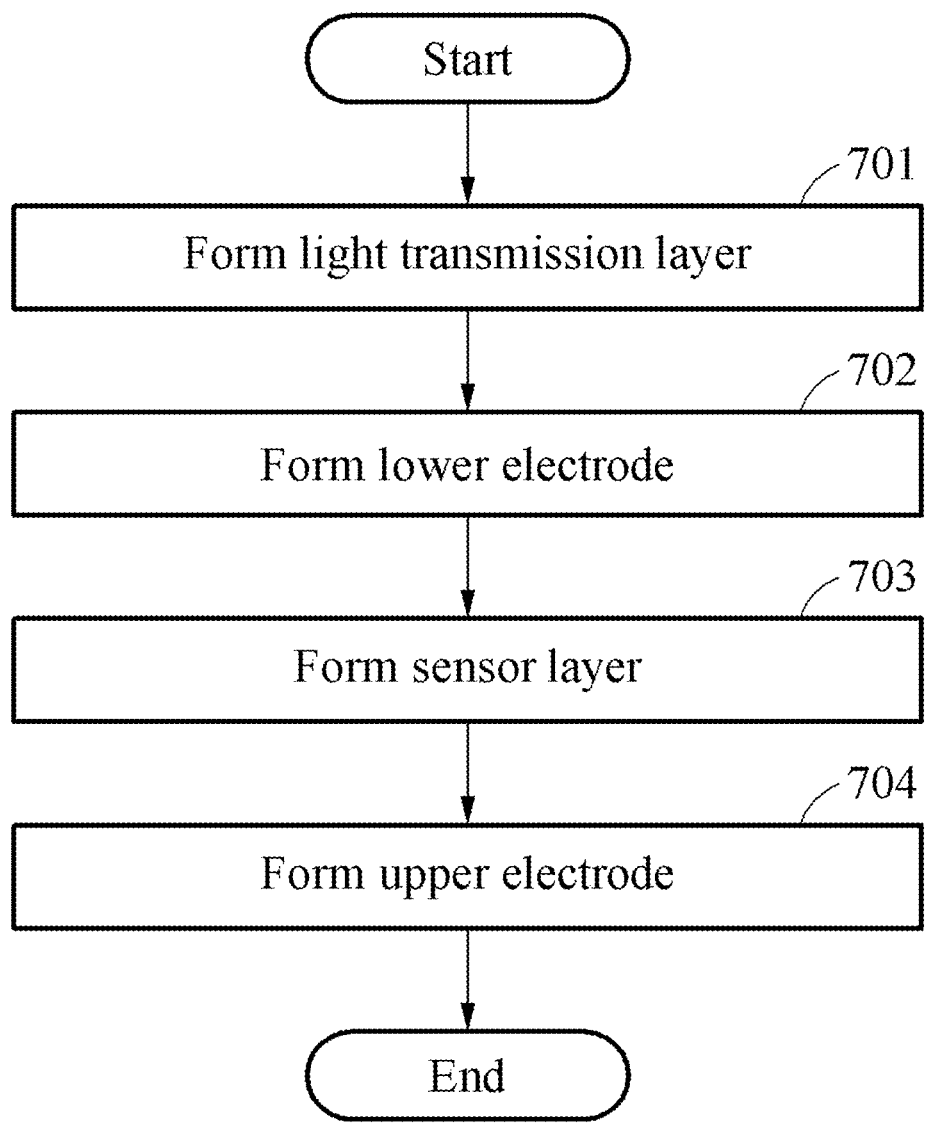
FIG. 7 illustrates a method of manufacturing a photodetector according to an embodiment of the present disclosure.

FIG. 7 illustrates a method of manufacturing a photodetector according to an embodiment of the present disclosure.

FIG. 7 illustrates a procedure for manufacturing a photodetector according to an embodiment of the present disclosure.

Referring to FIG. 7, in step 701 of a method of manufacturing a photodetector according to an embodiment of the present disclosure, a light transmission layer is formed.

That is, the method of manufacturing the photodetector includes forming a light transmission layer using any one of glass and quartz as silicon-based materials; and at least one of styrene-acrylonitrile copolymers (SAN), general purpose polystyrene (GPPS), poly vinyl chloride (PVC), acrylonitrile butadiene styrene (ABS), and polycarbonate (PC) as transparent plastic materials.

In step 702 of the method of manufacturing the photodetector according to an embodiment of the present disclosure, a lower electrode is formed.

That is, in the method of manufacturing the photodetector, a lower electrode may be formed using at least one of ITO, Al-doped ZnO (AZO), Ga-doped ZnO (GZO), In,Ga-doped ZnO (IGZO), Mg-doped ZnO (MZO), Mo-doped ZnO, Al-doped MgO, Ga-doped MgO, F-doped SnO2, and Nb-doped TiO2 as metal oxides, Ag nanowires, a highly conductive coating agent (PEDOT:PSS), and $CuAlO_2$ or any one of graphene, graphene oxide, carbon nanotubes, and fullerene ($C_{60}$) and may be formed in any one structure of $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, and $MoO_3/Ag/MoO_3$ as multilayer structures.

In step 703 of the method of manufacturing the photodetector according to an embodiment of the present disclosure, a sensor layer is formed on a lower electrode.

That is, the method of manufacturing the photodetector according to an embodiment of the present disclosure includes forming a sensor layer using at least one of poly (methylmethacrylate) (PMMA), polytetrafluoroethylene (PTFE), propylene glycol methyl ether acetate (PGMA), polyethylene glycol (PEG), polyacrylonitrile (PAN), polyurethane (PU), polyvinylpyrrolidone (PVP), polyethersulfone (PES), and polyarylethersulfones (PAES).

In addition, the method of manufacturing the photodetector includes forming a sensor layer using a transition metal dichalcogen compound or any one of $MoS_2$, $WS_2$, $MoSe_2$, $WSe_2$, $MoTe_2$, $Te_2$, $ZrS_2$, and $ZrSe_2$ as heterogeneous mixtures of transition metals.

That is, the method of manufacturing the photodetector includes forming a light absorber of the sensor layer using a transition metal dichalcogen compound or any one of $MoS_2$, $WS_2$, $MoSe_2$, $WSe_2$, $MoTe_2$, $Te_2$, $ZrS_2$, and $ZrSe_2$ as heterogeneous mixtures of transition metals.

In addition, in the method of manufacturing the photodetector according to an embodiment of the present disclosure, a transition metal dichalcogen compound or heterogeneous transition metal mixture for forming a sensor layer is subjected to liquid-phase exfoliation using a centrifugal separation technique so that the thickness of the sensor layer may be adjusted to 30 nm to 80 nm.

In step 704 of the method of manufacturing the photodetector according to an embodiment of the present disclosure, an upper electrode is formed on the sensor layer.

That is, in the method of manufacturing the photodetector according to an embodiment of the present disclosure, an upper electrode may be formed using at least one of ITO, Al-doped ZnO (AZO), Ga-doped ZnO (GZO), In,Ga-doped ZnO (IGZO), Mg-doped ZnO (MZO), Mo-doped ZnO, Al-doped MgO, Ga-doped MgO, F-doped $SnO_2$, and Nb-doped $TiO_2$ as metal oxides, Ag nanowires, a highly conductive coating agent (PEDOT:PSS), and $CuAlO_2$ or any one of graphene, graphene oxide, carbon nanotubes, and fullerene ($C_{60}$) and may be formed in any one structure of $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, and $MoO_3/Ag/MoO_3$ as multilayer structures.

Therefore, the present disclosure including forming a sensor layer using a peelable transition metal dichalcogen compound can provide a photodetector having high sensitivity regardless of a change in the wavelength of light in a simple process and at low cost.

As apparent from the above description, the present disclosure can provide a photodetector capable of more precisely measuring photoreaction in the visible light region by changing the size of a band gap according to the thickness of a sensor layer because the sensor layer is formed using a transition metal dichalcogen compound.

The present disclosure can provide a flexible photodetector by utilizing a transparent substrate and a transparent electrode and by forming a sensor layer using a peelable transition metal dichalcogen compound.

The present disclosure can provide a photodetector having high sensitivity regardless of a change in the wavelength of light in a simple process and at low cost by forming a sensor layer using a peelable transition metal dichalcogen compound.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:
1. A photodetector, comprising:
a light transmission layer;
a lower electrode disposed on the light transmission layer;
a sensor layer disposed on the lower electrode and including a light absorber; and
an upper electrode disposed on the sensor layer,
wherein, when an electric field is applied to the lower and upper electrodes such that current flows through the sensor layer, and light is transmitted to the sensor layer through the light transmission layer, the photodetector measures an energy band gap related to a change in the current,
wherein a thickness of the sensor layer is adjusted to 60 nm or 80 nm depending upon a separation rate of centrifugation for liquid-phase exfoliation of a transition metal dichalcogen compound or a heterogeneous transition metal mixture,
wherein the separation rate of centrifugation is controlled from 3000 rpm to 1000 rpm,
wherein, when the thickness of the sensor layer is the 60 nm or 80 nm, the photodetector controls an energy band gap of 2.25 Eg or 2.48 Eg for light having a wavelength of 500 nm and controls a detection amount of light according to the controlled energy band gap, wherein the photodetector measures the energy band gap of 2.25 Eg when the thickness of the sensor layer is 60 nm, and wherein the photodetector measures the energy band gap of 2.48 Eg when the thickness of the sensor layer is 80 nm.

2. The photodetector according to claim 1, wherein the light absorber is formed using the transition metal dichalcogen compound or any one of $MoS_2$, $WS_2$, $MoSe_2$, $WSe_2$, $MoTe_2$, Tee, $ZrS_2$, and $ZrSe_2$ as the heterogeneous transition metal mixture.

3. The photodetector according to claim 1, wherein the light transmission layer is formed using any one of glass and quartz as silicon-based materials; and at least one of styrene-acrylonitrile copolymers (SAN), general purpose polystyrene (GPPS), poly vinyl chloride (PVC), acrylonitrile butadiene styrene (ABS), and polycarbonate (PC) as transparent plastic materials.

4. The photodetector according to claim 1, wherein the light transmission layer is formed using at least one of polyethyleneterephthalate (PET), polyethylene (PE), polystyrene (PS), poly(methylmethacrylate) (PMMA), and polydimethylsiloxane (PDMS) as polymer-based flexible materials.

5. The photodetector according to claim 1, wherein the sensor layer is formed using at least one of poly(methylmethacrylate) (PMMA), polytetrafluoroethylene (PTFE), propylene glycol methyl ether acetate (PGMA), polyethylene glycol (PEG), polyacrylonitrile (PAN), polyurethane (PU), polyvinylpyrrolidone (PVP), polyethersulfone (PES), and polyarylethersulfones (PAES).

6. The photodetector according to claim 1, wherein the lower electrode is formed using at least one of ITO, Al-doped ZnO (AZO), Ga-doped ZnO (GZO), In,Ga-doped ZnO (IGZO), Mg-doped ZnO (MZO), Mo-doped ZnO, Al-doped MgO, Ga-doped MgO, F-doped $SnO_2$, and Nb-doped $TiO_2$ as metal oxides; Ag nanowires; a highly conductive coating agent (PEDOT:PSS); and $CuAlO_2$.

7. The photodetector according to claim 6, wherein the upper electrode is used using any one of Al, Au, Ag, Cu, Pt, W, Ni, Zn, Ti, Zr, Hf, Cd, and Pd as metal materials.

8. The photodetector according to claim 7, wherein the lower and upper electrodes are formed using any one of graphene, graphene oxide, carbon nanotubes, and fullerene ($C_{60}$).

9. The photodetector according to claim 7, wherein the lower and upper electrodes are formed in any one structure of $CuAlO_2$/Ag/$CuAlO_2$, ITO/Ag/ITO, ZnO/Ag/ZnO, ZnS/Ag/ZnS, $TiO_2$/Ag/$TiO_2$, ITO/Au/ITO, $WO_3$/Ag/$WO_3$, and $MoO_3$/Ag/$MoO_3$ as multilayer structures.

* * * * *